(12) United States Patent
Bergstedt et al.

(10) Patent No.: US 6,552,265 B1
(45) Date of Patent: Apr. 22, 2003

(54) PRINTED BOARD ASSEMBLY AND METHOD OF ITS MANUFACTURE

(75) Inventors: Leif Bergstedt, Sjömarken (SE); Per Ligander, Göteborg (SE); Katarina Boustedt, Kumla (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/412,697

(22) Filed: Oct. 5, 1999

(30) Foreign Application Priority Data

Oct. 6, 1998 (SE) .............................................. 9803392

(51) Int. Cl.$^7$ ............................................. H07L 23/28
(52) U.S. Cl. .................. 174/52.4; 174/250; 174/260; 361/748; 361/761; 361/762; 361/765
(58) Field of Search ................................ 174/52.1, 52.2, 174/52.3, 52.4, 250, 255, 260; 361/748, 760, 761, 765, 766, 762, 763, 764

(56) References Cited

U.S. PATENT DOCUMENTS

| | | | | |
|---|---|---|---|---|
| 3,500,428 A | * | 3/1970 | Allen | 342/371 |
| 4,659,425 A | | 4/1987 | Eggers et al. | 156/630 |
| 4,909,886 A | | 3/1990 | Noguchi | 156/285 |
| 4,966,642 A | | 10/1990 | Zitzmann | 156/164 |
| 5,167,997 A | | 12/1992 | Chamberlain et al. | 428/76 |
| 5,208,728 A | * | 5/1993 | Schirmer | 361/380 |
| 5,268,064 A | | 12/1993 | Woo et al. | 156/630 |
| 5,269,863 A | | 12/1993 | Middelman | 156/177 |
| 5,347,258 A | * | 9/1994 | Howard et al. | 338/333 |
| 5,835,356 A | * | 11/1998 | Wieloch et al. | 361/761 |
| 5,837,155 A | | 11/1998 | Inagaki et al. | 216/18 |
| 5,875,100 A | * | 2/1999 | Yamashita | 361/764 |
| 5,959,256 A | * | 9/1999 | Saida et al. | 174/258 |

FOREIGN PATENT DOCUMENTS

| | | |
|---|---|---|
| DE | 3840704 | 7/1989 |
| DE | 19634016 | 3/1997 |
| EP | 0291629 | 11/1988 |
| EP | 0470584 | 12/1992 |
| EP | 0813355 | 12/1997 |
| WO | WO 9520479 | 8/1995 |

OTHER PUBLICATIONS

Wirlée, S–O.; International–Type Search Report; Jul. 16, 1999; Search Request No. SE 98/01105; pp.1–4.
http://www.merix.com/resourcecentr/tech/resinfoil.html; "Resin Coated Copper Foils", 2 pages.
http://www.fcf.co.jp/en/res.htm; "Resin Coated Copper Foil", 2 pages.

* cited by examiner

Primary Examiner—Anthony Dinkins
Assistant Examiner—Carmelo Oliva
(74) Attorney, Agent, or Firm—Jenkens & Gilchrist, P.C.

(57) ABSTRACT

A compact printed board assembly has a patterned copper-coated substrate (1) with electronic components (5, 12) mounted thereon. Depending on the height of the components, either SBU lacquer (11) or non-flow prepreg (3) and laminate (4) surround the electronic components. This subassembly is then sandwiched between two RC (resin coated) copper foils (8) with the resin (7) facing the components (5, 12) and burying them, thereby providing a new etchable copper surface which can be connected by means of microvias (10) to the embedded components (5, 12).

19 Claims, 2 Drawing Sheets

PRINTED BOARD ASSEMBLY AND METHOD OF ITS MANUFACTURE

TECHNICAL FIELD OF THE INVENTION

The present invention relates to a printed board assembly, comprising a copper coated substrate with electronic components mounted thereon. The substrate with components are sandwiched between resin coated foils thus embedding the components. The invention also relates to a method of manufacturing such a printed board assembly.

DESCRIPTION OF RELATED ART

EP 0 813 355 (A2) to International Business Machines Inc. relates to a printed circuit board construction with stacked capacitive planes. The entire stack is then covered with epoxy glass to which copper foil is then applied. EP 0 813 355 (A2) does not provide for embedding anything other than flat capacitive planes, having an etched outer surface to which the epoxy adheres and bonds the copper foil.

Similarly, DE-A 196 34 016 (A1) to Taiyo Ink Mfg. Co. Ltd. describes coating a printed circuit board having circuit patterns etched therein with resin and laying a similar etched copper layer thereon which is in turn coated with resin. This reference, as that described above, does not describe anything other than the embedding of flat etched copper sheets.

SUMMARY OF THE INVENTION

A printed board assembly is provided comprising a substrate coated with an electrically conducting material, such as etched copper, electrical components being mounted on said substrate, said substrate with components being covered on both sides with resin coated conducting foil, the resin of said resin coated foil facing the substrate and burying said components, said foil being etched with a circuit pattern, a non-conducting material being disposed in the areas between said electrical components.

The present invention enables more components to be packed more compactly within and on the carrier, thereby making it possible to improve the electrical performance, and to integrate the electrical shielding in the carrier. The mechanical stability and strength of the entire assembly is also improved.

According to one embodiment of the printed board assembly according to the present invention, said components are chip resistors and that said carrier is coated between said chip resistors with a sequential built-up (SBU) lacquer. The lacquer is applied in the areas between the chip resistors sequentially until it reaches the level of the top surfaces of the chip resistors, whereupon the resin coated foil is easily applied to the essentially flat surface. This is a very simple and low cost method of integrating chip resistors into the carrier.

According to another embodiment of the printed board assembly according to the present invention said carrier is covered in the areas between said components with a preimpregnated non-conducting resin mat or prepreg covered with a laminate, both provided with holes for said components. This enables the principle of the invention to be applied when higher components than chip resistors are mounted on the substrate. There is either sufficient resin to fill out any remaining space between these higher electronic components, or alternatively, these small remaining spaces can be coated with SBU lacquer before the resin coated foil is applied thereon.

A method is also provided for manufacturing such a printed board assembly, comprising the steps of: mounting electronic components on a substrate patterned copper; covering only the areas of the copper coated substrate between the mounted components with a non-conducting material approximately up to the level of the mounted components, sandwiching the substrate, components and non-conducting material between two sheets of resin coated conducting foil, the resin on said foils facing the substrate and burying said components, and etching circuit patterns in the exposed copper surfaces of the resin coated conducting foils. This is a very economical way of achieving vertical packing of many components in a way which is advantageous structurally and electrically.

DETAILED DESCRIPTION OF EMBODIMENTS

Figure 1A:
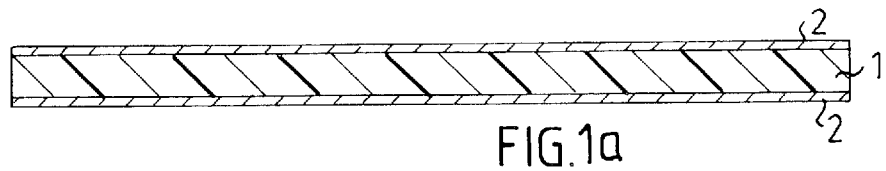
FIGS. 1(a–e) show the sequence of steps in manufacturing a printed board assembly of the present invention in accordance with one embodiment of the invention.
Figure 1B:
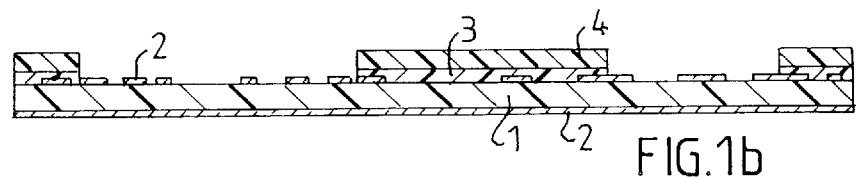
Figure 1C:
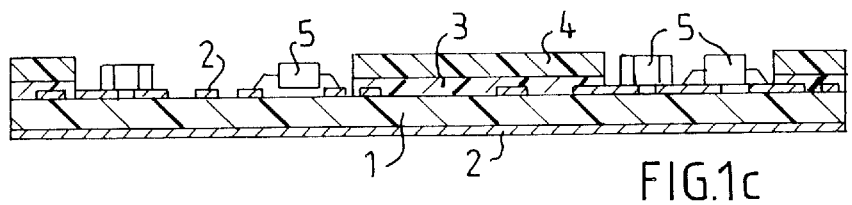

FIG. 1 shows the method of the present invention in a first embodiment starting at step 1(a) with a standard copper coated 2 substrate 1. In step 1(b), at least one of the copper coatings 2 on the substrate is etched in the known manner to provide a circuit pattern and then a non-conducting prepreg 3 and laminate 4, which have been machined to create holes for the areas where the electronic components are to be mounted, are pressed together with the substrate 1. The prepreg is a resin impregnated mat of "non-flow" type.

The electronic components 5, which in this case can be integrated circuit components etc., are then mounted in the openings in the prepreg 3 and laminate 4. This is shown in step 1(c).

Figure 1D:
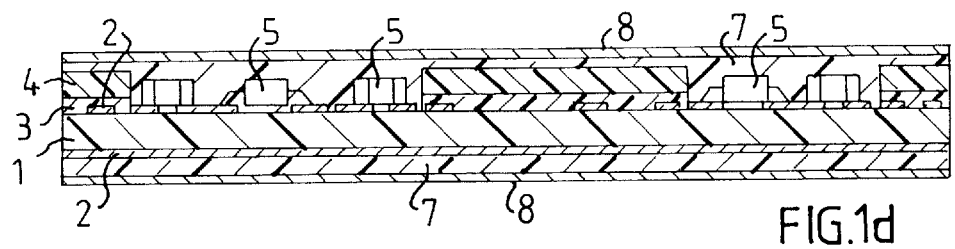
Figure 1D:
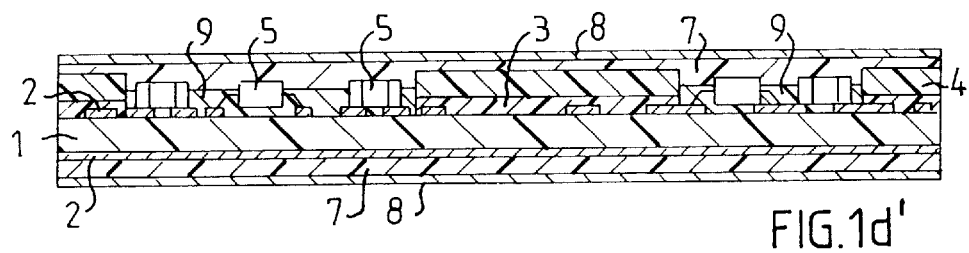

The subassembly comprising the copper coated substrate 1, the prepreg 3 and the laminate 4 are then sandwiched between two resin coated copper foils 8 so that the resin 7 faces inwards. The result is shown in FIG. 1(d).

It may be the case that the resin 7 does not fill the spaces under and around the electronic components 5. In that case a lacquer, which may be an SBU (sequentially built-up) lacquer 9 is applied over the electronic components. This variant is shown in FIG. 1(d').

Figure 1E:
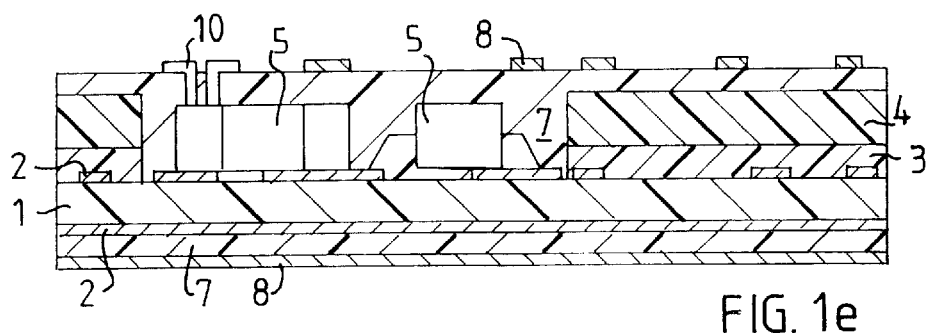

At least one of the foils 8 is then etched to form another printed circuit layer and microvia holes 10 are made connecting the foil 8 layer to the electronic components. This assembly is shown in FIG. 1(e). It is a multi-layer assembly providing exceptional structural stability and compact arrangement of many circuits. Heat can also be dissipated through the via holes.

Another embodiment of the invention is shown in FIGS. 2(a–e) which show it applied to a printed board assembly which embeds only chip resistors under RC foil. The steps are essentially those described in relation to the embodiments shown in FIGS. 1(a–e) and the corresponding components have been given the same reference numerals as in FIGS. 1(a–e), with the exception that the non-conducting material disposed in the areas between the electrical components is only SBU lacquer. The prepreg and the laminate used in the embodiments shown in FIGS. 1(a–e) are not necessary since chip resistors are rather thin.

Figure 2A:
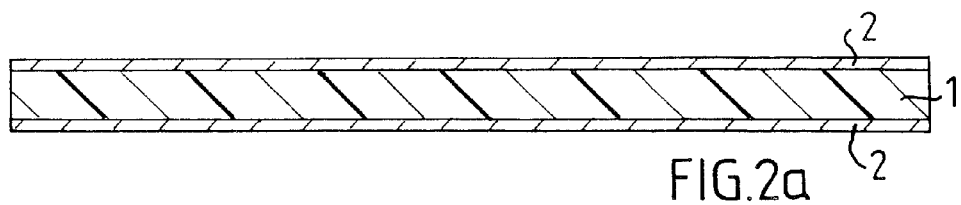
FIGS. 2(a–e) show the sequence of steps in manufacturing a printed board assembly of the present invention in accordance with another embodiment of the invention.
Figure 2B:
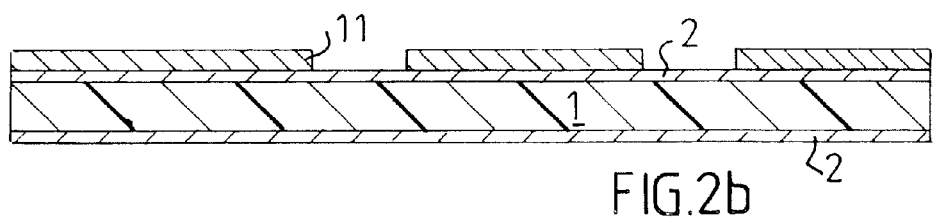
Figure 2C:
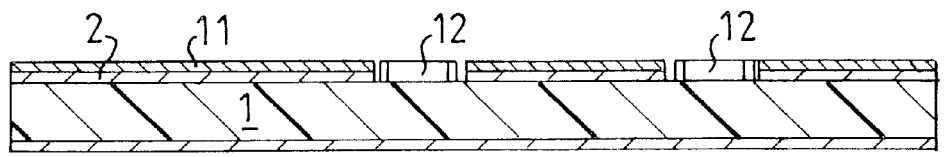

FIG. 2(a) shows a standard copper-coated substrate 1. A photosensitive dielectric material 11 is painted onto the copper 2 on one side, and openings are made therein, (FIG. 2(b)), into which chip resistors 12 are mounted (FIG. 2(c)).

Figure 2D:
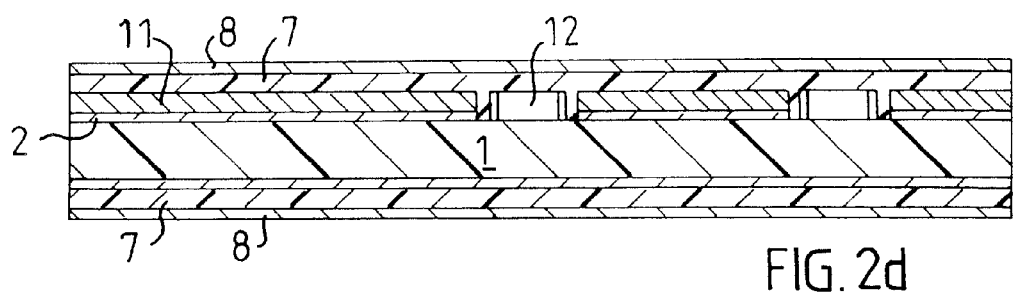

This subassembly is then sandwiched, as in the example above, between two resin coated copper foils 8 so that the resin 7 faces inwards. The result is shown in FIG. 2(d).

Figure 2E:
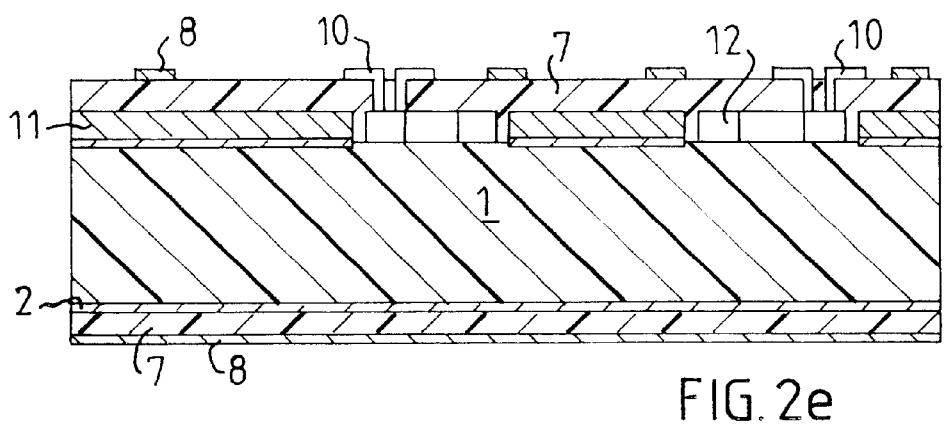

As in the example above, at least one of the foils 8 is then etched to form a printed circuit layer and microvia holes 10 are made connecting the chip resistors 12 with the foil layer 8. This assembly is shown in FIG. 2(e), which allows the chip resistors and other passive components to be embedded leaving space exposed on the upper layer for more active components. The chip resistors 12 may also be contacted by soldering to the patterned copper coating 2 on the substrate 1. This method provides great flexibility as regards contacting the components.

It is of course also possible to repeat the process and build up even more layers on top of the foil layer 8.

What is claimed is:

1. Printed board assembly, comprising:
   a) a substrate coated with an electrically conducting material,
   b) electrical components mounted on some areas of said substrate,
   c) a non-conducting material disposed in areas between said electrical components, and
   d) a metal foil pre-coated with resin on one side of said foil, wherein said foil covers both sides of said substrate including the electrical components and the non-conducting material, wherein the resin of said foil faces the substrate and covers said electrical components such that the electrical components are buried under the resin, and said foil is etched with a circuit pattern.

2. Printed board assembly according to claim 1, wherein said electrical components are chip resistors and said non-conducting material is a sequential built-up (SBU) lacquer.

3. Printed board assembly according to claim 1, wherein said non-conducting material comprises a preimpregnated non-conducting resin mat having holes for said electrical components.

4. Printed board assembly according to claim 1, wherein said electrically conducting material is patterned copper.

5. Printed board assembly according to claim 1, wherein said non-conducting material comprises a prepreg covered with a laminate having holes for said electrical components.

6. Printed board assembly according to claim 1, wherein said non-conducting material substantially reaches the level of the top of said electrical components.

7. Printed board assembly according to claim 1, wherein said non-conducting material is a preimpregnated non-conducting resin mat having holes for said electrical components, said printed board assembly further comprising another non-conducting material disposed in remaining spaces between said electrical components, said another non-conducting material is a sequential built-up (SBU) lacquer.

8. Printed board assembly according to claim 1, wherein said non-conducting material is a prepreg covered with a laminate having holes for said electrical components, said printed board assembly further comprising another non-conducting material disposed in remaining spaces between said electrical components, said another non-conducting material is a sequential built-up (SBU) lacquer.

9. The printed circuit board assembly according to claim 8, further comprising microvia holes connecting the foil to said electrical components.

10. The printed circuit board assembly according to claim 8, wherein said electrical conducting material comprises etched copper.

11. A printed circuit board assembly, comprising:
   a substrate coated with an electrically conducting material;
   electrical components mounted on said substrate; and,
   a metal foil pre-coated with resin on one side of said foil, wherein said foil covers both sides of said substrate including the electrical components and a non-conducting material, the resin of said foil facing the substrate and covering said electrical components, such that the electrical components are buried under the resin.

12. The printed circuit board assembly according to claim 11, wherein said non-conducting material comprises a sequentially built-up (SBU) lacquer coating disposed in areas between said electrical components.

13. The printed circuit board assembly according to claim 12, wherein said SBU lacquer substantially reaches the level of the top of said electrical components.

14. The printed circuit board assembly according to claim 11, wherein said electrical components are chip resistors.

15. The printed circuit board assembly according to claim 11, wherein said non-conducting material disposed in areas between said electrical components.

16. The printed circuit board assembly according to claim 15, wherein said non-conducting material is a preimpregnated non-conducting resin mat having holes for mounting said electrical components.

17. The printed circuit board assembly according to claim 15, wherein said non-conducting material is a prepreg covered with a laminate having holes for mounting said electrical components.

18. The printed circuit board assembly according to claim 15, wherein said non-conducting material also comprises a sequentially built-up (SBU) lacquer disposed in areas under and around said electrical components not filled by the resin of said resin coated conducting foil.

19. The printed circuit board assembly according to claim 11, wherein the foil of said resin coated conducting foil being etched with a circuit pattern.

* * * * *

UNITED STATES PATENT AND TRADEMARK OFFICE
CERTIFICATE OF CORRECTION

PATENT NO.    : 6,552,265 B1
DATED         : April 22, 2003
INVENTOR(S)   : Leif Bergstedt et al.

It is certified that error appears in the above-identified patent and that said Letters Patent is hereby corrected as shown below:

<u>Column 2,</u>
Line 3, replace "a substrate patterned copper;" with -- a substrate coated with patterned copper; --

Signed and Sealed this

Sixteenth Day of December, 2003

JAMES E. ROGAN
*Director of the United States Patent and Trademark Office*